(12) United States Patent
Schlesser et al.

(10) Patent No.: US 7,632,454 B2
(45) Date of Patent: Dec. 15, 2009

(54) DENSE, SHAPED ARTICLES CONSTRUCTED OF A REFRACTORY MATERIAL AND METHODS OF PREPARING SUCH ARTICLES

(75) Inventors: Raoul Schlesser, Cary, NC (US); Rafael F. Dalmau, Cary, NC (US); Vladimir Noveski, Chandler, AZ (US); Zlatko Sitar, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 357 days.

(21) Appl. No.: 11/398,270

(22) Filed: Apr. 5, 2006

(65) Prior Publication Data

US 2006/0280640 A1    Dec. 14, 2006

Related U.S. Application Data

(60) Provisional application No. 60/668,744, filed on Apr. 6, 2005.

(51) Int. Cl.
*B22F 1/02* (2006.01)
(52) U.S. Cl. ......................................... 419/39; 264/625
(58) Field of Classification Search ................. 501/103; 264/649, 625; 419/39
See application file for complete search history.

(56) References Cited

U.S. PATENT DOCUMENTS

| | | | |
|---|---|---|---|
| 3,352,951 A | 11/1967 | Sara | |
| 4,519,966 A | 5/1985 | Aldinger et al. | |
| 5,139,720 A | * 8/1992 | Takeda et al. | ................ 264/649 |
| 5,368,812 A | 11/1994 | Calka et al. | |
| 5,993,545 A | 11/1999 | Lupton et al. | |
| 6,296,956 B1 | 10/2001 | Hunter | |
| 6,719,843 B2 | 4/2004 | Schowalter et al. | |

(Continued)

FOREIGN PATENT DOCUMENTS

FR    1 184 541 A    7/1959

(Continued)

OTHER PUBLICATIONS

Dalmau et al., "Crucible Selection in AlN Bulk Crystal Growth", *Mater. Res. Symp. Proc.*, 2004, pp. 1-5.

(Continued)

*Primary Examiner*—Roy King
*Assistant Examiner*—Weiping Zhu
(74) *Attorney, Agent, or Firm*—Alston & Bird LLP

(57) ABSTRACT

The invention provides a method of forming a dense, shaped article, such as a crucible, formed of a refractory material, the method comprising the steps of placing a refractory material having a melting point of at least about 2900° C. in a mold configured to form the powder into an approximation of the desired shape. The mold containing the powder is treated at a temperature and pressure sufficient to form a shape-sustaining molded powder that conforms to the shape of the mold, wherein the treating step involves sintering or isostatic pressing. The shape-sustaining molded powder can be machined into the final desired shap and then sintered at a temperature and for a time sufficient to produce a dense, shaped article having a density of greater than about 90% and very low open porosity. Preferred refractory materials include tantalum carbide and niobium carbide.

23 Claims, 3 Drawing Sheets

U.S. PATENT DOCUMENTS

| | | | |
|---|---|---|---|
| 2002/0013211 A1* | 1/2002 | Takenami et al. | 501/103 |
| 2002/0170490 A1 | 11/2002 | Vodakov et al. | |
| 2005/0178315 A1 | 8/2005 | Helava | |
| 2005/0223967 A1 | 10/2005 | Schowalter et al. | |

FOREIGN PATENT DOCUMENTS

| | | |
|---|---|---|
| WO | WO-2005/012602 A1 | 2/2005 |

OTHER PUBLICATIONS

Schlesser et al., "Bulk Growth of AlN Single Crystals", *Abstract Book*, International Workshop on Bulk Nitride Semiconductors III, Zakopane, Poland, Sep. 4-9, 2004.

Schlesser et al., "Crucible materials for growth of aluminum nitride crystals", *Journal of Crystal Growth*, 2005, pp. 75-80, vol. 281.

Kislyi et al., "Sintering Kinetics of Tantalum Carbide", Powder Metallurgy and Metal Ceramics, 1982, pp. 765-767, vol. 21, No. 10.

Noveski et al., "Mass Transfer in AlN Crystal Growth at High Temperatures," *J. Cryst. Growth*, 2004, vol. 264, pp. 369-378.

Noveski et al., "Seeded Growth of Bulk AlN Crystals and Grain Evolution in Polycrystalline AlN Boules," *J. Cryst. Growth*, 2005, vol. 279, pp. 13-19.

Noveski et al., "Vapor Phase Transport of AlN in an RF Heated Reactor: Low and High Temperature Studies," *Mat. Res. Soc. Symp. Proc.*, 2004, vol. 798, pp. Y2.8.1 Y2.8.6.

Raghothamachar et al., "Synchrotron White Beam Topography Characterization of Physical Vapor Transport Grown AlN and Ammonothermal GaN," *J. Cryst. Growth*, 2002, vol. 246, pp. 271-280.

Schlesser et al., "Growth of AlN Bulk Crystals from the Vapor Phase," *Mat. Res. Soc. Symp. Proc.*, 2002, vol. 693, pp. 19.4.1-19.4.6.

Schlesser et al., "Seeded Growth of AlN Bulk Single Crystals by Sublimation," *J. Cryst. Growth*, 2002, vol. 241, pp. 416-420.

Sitar et al., "Growth of AlN Crystals by Vaporization of Al and Sublimation of AlN Powder," IPAP Conference Series 4, Proceedings of 21$^{st}$ Century COE Joint International Workshop on Bulk Nitrides, Jun. 15, 2004.

Strassburg et al., "The Growth and Optical Properties of Large, High-Quality AlN Single Crystals," *J. Appl. Phys.*, 2004, vol. 96(10), pp. 5870-5876.

Zhuang et al., "Grain Expansion and Subsequent Seeded Growth of AlN Single Crystals," *Mater. Res. Soc. Symp. Proc.*, 2005, vol. 831, pp. E11.1.1-E11.1.6.

* cited by examiner

DENSE, SHAPED ARTICLES CONSTRUCTED OF A REFRACTORY MATERIAL AND METHODS OF PREPARING SUCH ARTICLES

CROSS REFERENCE TO RELATED APPLICATIONS

This application claims the benefit of U.S. Provisional Application No. 60/668,744, filed Apr. 6, 2005, which is incorporated herein by reference in its entirety and for all purposes.

FEDERALLY SPONSORED RESEARCH OR DEVELOPMENT

The research underlying this invention was supported in part with funds from Office of Naval Research (ONR) grant no. N00014-01-1-0716. The United States Government has certain rights in this invention.

FIELD OF THE INVENTION

The present invention relates to dense, shaped articles comprising a refractory material, such as crucibles suitable for use in bulk crystal growth by physical vapor transport. The invention also relates to methods of fabricating dense shaped articles using a sintering step.

BACKGROUND OF THE INVENTION

The growth of aluminum nitride (AlN) bulk crystals by sublimation of an AlN source requires elevated temperatures, typically in a range of 1800° C. to 2300° C., with the upper end of the range yielding commercially viable growth rates of 0.1 to greater than 1 mm/hr. Reactor pressures are typically near or below one atmosphere, and the reactor headspace gas consists of pure nitrogen or nitrogen/hydrogen mixtures. The elevated temperature requirements, combined with the chemically aggressive nature of the Al vapor, severely limit the choice of reactor hot zone materials, and most notably, the selection of reaction crucibles.

The choice of crucibles for physical vapor transport (PVT) growth of AlN bulk crystals is dictated by several limiting requirements. Ideally, the crucible should be (1) refractory and compatible with the aforementioned growth temperatures, (2) inert to chemically aggressive Al vapor, (3) a negligible source of contamination to the growth process, (4) re-usable for multiple growth runs, (5) relatively inexpensive, and (6) manufacturable in various shapes and dimensions.

Plasma-spray processes have been used to form crucibles for crystal growth. The plasma-spray process involves spraying vaporized material onto a surface to provide a coating. A refractory material in the form of a powder is injected into a very high temperature plasma flame, where it is rapidly heated and accelerated to a high velocity. The hot material impacts on the substrate surface and rapidly cools to form a coating.

However, plasma-spray processes have several drawbacks. For example, plasma-spray processes do not allow precise machining of shapes before they are densified and rendered too hard for conventional metal machining tools. Further, plasma-spray processes are characterized by relatively low yields, which is problematic due to the high cost of most refractory materials, and are limited in the thicknesses and shapes that can be formed.

There remains a need in the art for new highly dense shaped articles and methods for preparing such articles that overcome the shortcomings of the prior art.

BRIEF SUMMARY OF THE INVENTION

The present invention provides a two-stage process for fabrication of dense, near-net shapes made of refractory materials. Advantageous features of certain embodiments of the inventive process include: (1) allowing precise machining of shapes before they are densified and rendered extremely hard; (2) offering high utilization yield of expensive starting materials (close to 100%, depending on desired shape); (3) imposing practically no constraints on the shape or thickness of the final product; and (4) offering uniform materials properties across the entire shape. All these advantages are considered major shortcomings of the competing plasma-spray processes.

In one aspect, the present invention provides a method of forming a dense, shaped article formed of a refractory material. A powder comprising a refractory material is provided, the refractory material having a melting point of at least about 2900° C. The refractory material powder is placed in a mold configured to form the powder into an approximation of the desired shape. Thereafter, the mold containing the powder is treated at a temperature and a pressure sufficient to form a self-supporting and shape-sustaining molded powder that conforms to the shape of the mold. The shape-sustaining molded powder should have a density of about 60% to about 80%, preferably about 70% or more. Optionally, the shape-sustaining molded powder can then be machined to form the final desired shape using conventional metal tools and known machining processes. Following machining, the shape-sustaining molded powder is sintered at a temperature and for a time sufficient to produce a dense, shaped article having a density of greater than about 90%, a total porosity of no more than about 10%, and a total open porosity of no more than about 1%.

The refractory material used in the present invention may vary. In certain embodiments, the refractory material is a refractory metal or a derivative thereof, such as borides, carbides, nitrides, oxides, carbonitrides, silicides, and sulfides of refractory metals. The refractory material can also be an alloy of any of the above-described refractory materials or a mixture of elemental constituents of any of the above-described refractory materials. In a preferred embodiment, the refractory material is a carbide or nitride of a refractory metal, such as tantalum carbide, niobium carbide, hafnium carbide, tantalum nitride, niobium nitride, and hafnium nitride, or an alloy thereof.

The initial treating step may comprise sintering the powder contained with the mold at a temperature of about 1000° C. to about 2000° C. while concurrently applying a uni-axial pressure of at least about 50 MPa. Alternatively, the initial treating step may comprise isostatically pressing the powder contained within the mold at a pressure of at least about 100 MPa and at or near room temperature. The final sintering step may comprise sintering the molded powder at a temperature of about 2200° C. and at sub-atmospheric or near-atmospheric pressure.

In another embodiment of the invention, a method of forming a dense, shaped, tantalum carbide article is provided, the method including the steps of providing a tantalum carbide powder or a mixture of Ta and C in powder form; placing the powder in a mold configured to form the powder into a desired shape; sintering the powder contained within the mold in an inert atmosphere or under a vacuum and at a temperature of at least about 1500° C., while concurrently applying a uni-axial pressure of at least about 50 MPa, to form a self-supporting and shape-sustaining molded tantalum carbide powder that conforms to the shape of the mold, the molded powder having a density of about 60 to about 80%; optionally, machining the shape-sustaining molded tantalum carbide powder to further shape the molded powder; and sintering the shape-sustaining molded tantalum carbide powder in an inert atmosphere at a temperature of about 2100 to about 2500° C. and a pressure ranging from vacuum to about 10 atm for a time sufficient to produce a dense, shaped, tantalum carbide article having a density greater than about 95%, a total porosity of no more than about 5%, and a total open porosity of no more than about 0.5%.

In another aspect, the present invention provides a dense, shaped article prepared according to the above-described method. In certain embodiments, the dense, shaped article has a density of greater than about 95%, a total porosity of no more than about 5%, and a total open porosity of no more than about 0.5%. In other embodiments, the dense, shaped article has a density of greater than about 97%, a total porosity of no more than about 3%, and a total open porosity of no more than about 0.25%. The dense, shaped article preferably comprises at least about 95% by weight of the refractory material.

Articles formed according to the present invention can have a variety of shapes and sizes. In certain preferred embodiments, the dense, shaped article is a crucible adapted for use in growing bulk crystals by physical vapor transport. In one embodiment, the crucible of the invention has a useful life of at least 200 hours at crystal growth temperatures of at least about 2200° C.

BRIEF DESCRIPTION OF THE DRAWINGS

Figure 1:
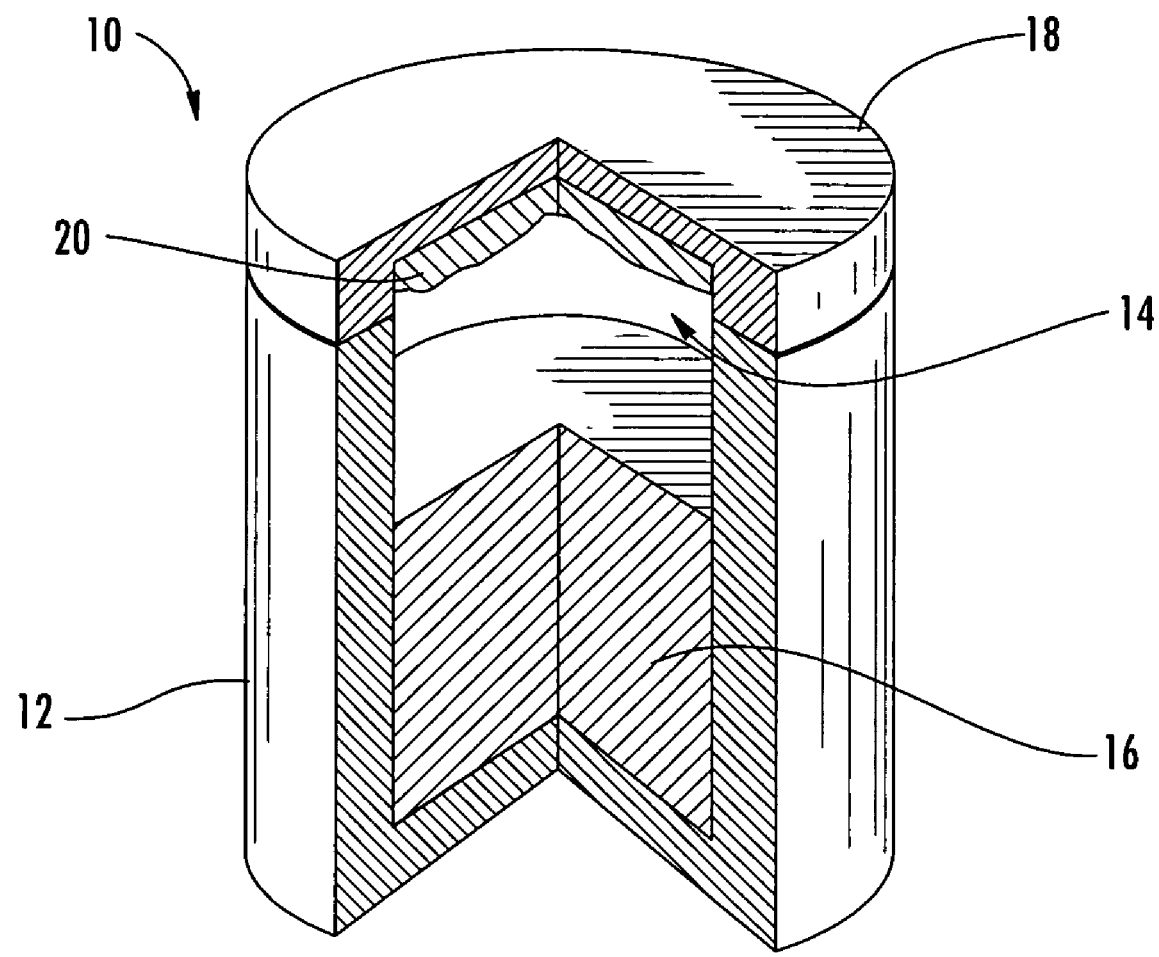
Figure 2A:
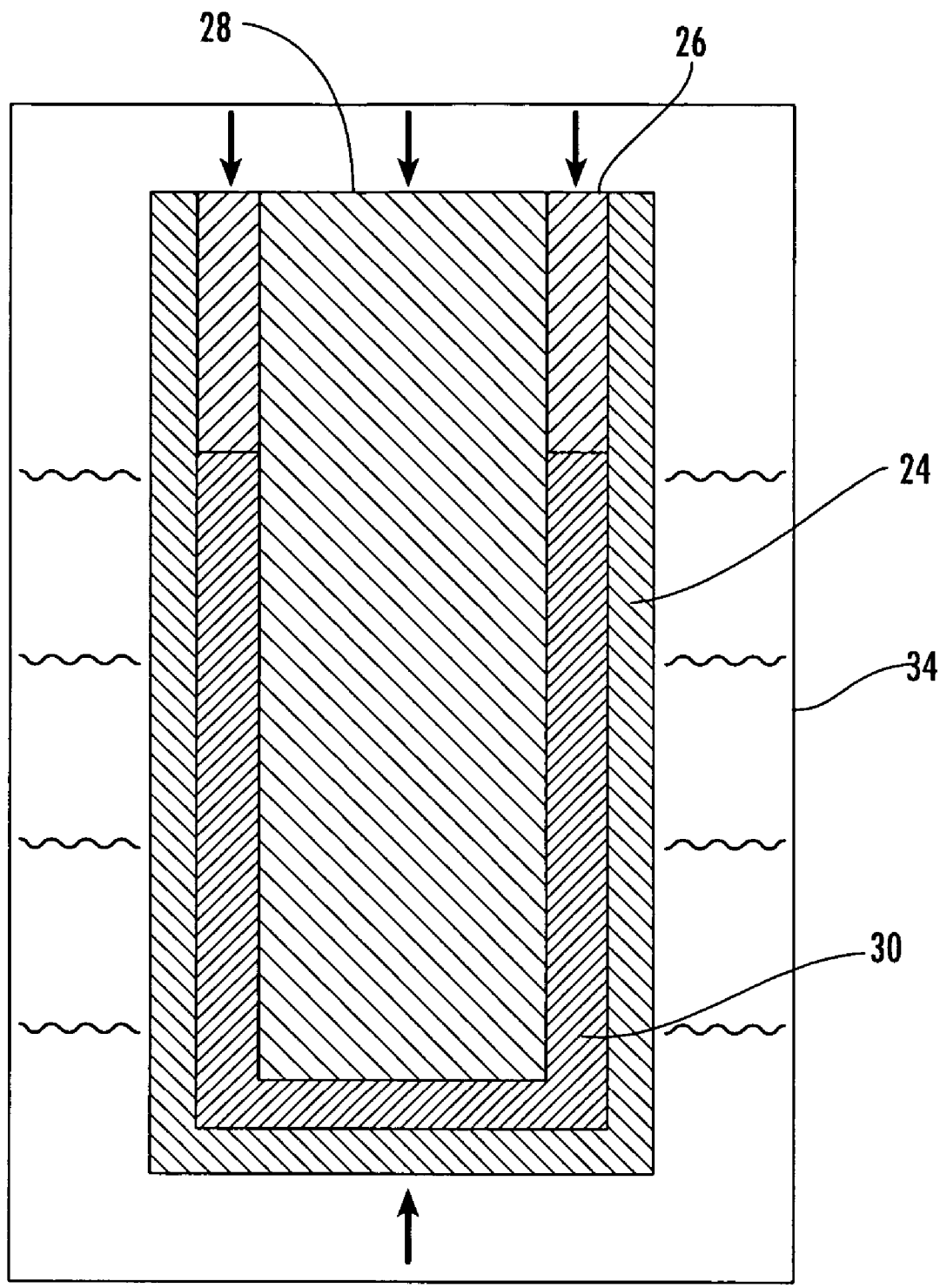
Figure 2B:
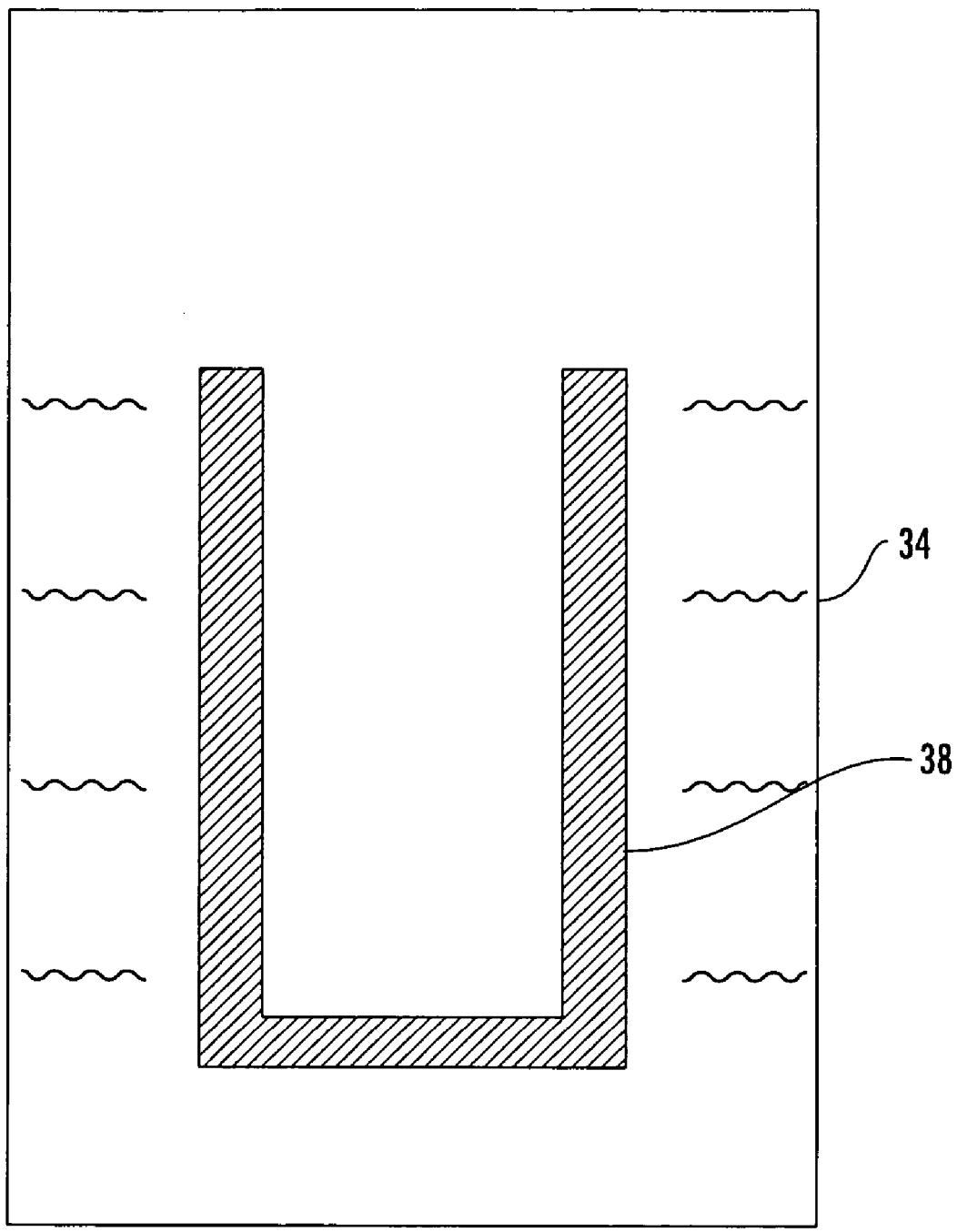

Having thus described the invention in general terms, reference will now be made to the accompanying drawings, which are not necessarily drawn to scale, and wherein:

FIG. 1 illustrates an exemplary cylindrical crucible that can be fabricated using the method of the invention;

FIG. 2a is a schematic representation of a first sintering step in one embodiment of the method of the invention; and FIG. 2b is a schematic representation of a second sintering step in one embodiment of the method of the invention.

DETAILED DESCRIPTION OF THE INVENTION

The present inventions now will be described more fully hereinafter with reference to the accompanying drawing, in which one, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used in the specification, and in the appended claims, the singular forms "a", "an", "the", include plural referents unless the context clearly dictates otherwise.

The present invention provides a method of forming a dense shaped article constructed of a refractory material. The refractory material used to construct the article preferably has a melting point of at least about 2900° C., more preferably at least about 3200° C., and most preferably at least about 3600° C. In some embodiments, the melting point of the refractory material, and thus the article constructed therefrom, will be at least about 3900° C.

The refractory material is preferably a refractory metal or a derivative thereof. Refractory metals are understood in the art to refer to a class of metals that exhibits extraordinary resistance to heat, wear, and corrosion. Exemplary refractory metals include tungsten (W), molybdenum (Mo), niobium (Nb), tantalum (Ta), rhenium (Re), iridium (Ir), hafnium (Hf), osmium (Os), and zirconium (Zr). Exemplary derivatives of refractory metals include borides, carbides, nitrides, oxides, carbonitrides, silicides, and sulfides. Preferred derivatives of refractory metals include nitrides and carbides. The refractory material forming the dense shaped article can also be alloys of two or more refractory metals or derivatives thereof. In certain embodiments, the refractory material comprises a metalloid (e.g., boron) instead of a refractory metal, such as certain nitrides of metalloids. In yet another alternate embodiment, the refractory material is carbon.

The shaped article preferably comprises at least about 95% by weight of the above-described refractory materials, more preferably at least about 97% by weight, and most preferably at least about 99% by weight, based on the total weight of the shaped article. However, the refractory materials can be alloyed with other materials present in minor amounts without departing from the present invention, such as aluminum or aluminum nitride.

In a preferred embodiment, the refractory material is tantalum, niobium, hafnium, tantalum nitride (TaN), tantalum carbide (TaC), niobium nitride (NbN), niobium carbide (NbC), hafnium nitride (HfN), hafnium carbide (HfC), or an alloy thereof. Tantalum carbide, niobium carbide, or alloys thereof are particularly preferred where the dense shaped article is a crucible for use in growing bulk crystals via a PVT process because crucibles formed of such materials exhibit excellent durability and compatibility with crystal growth materials (e.g., Al vapor), and produce high quality crystals with minimal impurities.

In the first step of the process, the refractory material in powder form is placed in a mold that is dimensioned to conform the powdered material to a shape that is roughly equivalent to the desired final shape of the article. Due to shrinkage of the powdered material during processing, the mold will typically be oversized in such a way that the molded powder, following shrinkage, will have a shape and size that is roughly equivalent to the desired shape and size. In some embodiments, the shape of the processed article will so closely approximate the final desired shape that no further machining is necessary. The powdered refractory material can be any of the refractory materials noted above or mixtures of the elemental constituents of the above-noted refractory materials. For example, the powdered materials placed in the mold could be powdered TaC or a mixture of Ta and C in order to form an article made of TaC. Similarly, powdered NbC or a mixture of Nb and C could be placed in the mold in order to produce an NbC article. No additional additives or binders are required in the practice of the present invention. Although particle size may vary, in one preferred embodiment, the particle size of the powdered material is in the range of about 0.1 to about 50 μm, more preferably about 1 to about 5 μm. The mold can be made of any material that can withstand the temperatures and pressures used in the present invention, such as graphite or refractory metals such as molybdenum.

The mold containing the powder is treated at a temperature and pressure sufficient to fuse the powder together in a self-supporting and shape-sustaining form, meaning that the powder will retain the shape of the mold following treatment. The shape-sustaining powder or "green" will typically have a final density of about 60 to about 80% of theoretical density. In one embodiment, the density of the green is about 70% or more.

The initial treating step preferably comprises sintering the powder contained within the mold at a temperature of about 1000 to about 2000° C., preferably about 1500 to about 1700° C. Preferably, during the sintering step, a uni-axial pressure of at least about 50 MPa, preferably at least about 100 MPa, is applied to the powder. For example, where the desired article shape is a cylindrical crucible, the refractory material powder is placed in a first mold piece having a hollow cylindrical shape. Pressure is applied to the powder during sintering by pressing additional mold pieces, such as cylindrical and annular mold pieces, downward into the hollow cylinder of the mold, while simultaneously pressing the first mold piece upward, in order to aid in conforming the refractory material powder to the desired shape of a cylindrical crucible. Any suitable device capable of achieving the desired pressures noted above can be used to apply pressure to the mold pieces, such as various pneumatic or hydraulic presses.

A schematic representation of this step in the process is provided in FIG. 2a, which depicts a cross-sectional view of a first mold piece 24 having a hollow cylindrical shape, an annular mold piece 26, and a solid cylindrical mold piece 28. The three mold pieces are uni-axially pressed upon a refractory material powder 30 in order to conform the powder to the desired shape of a cylindrical crucible. The mold containing the powder 30 is placed in a furnace 34 such that heat can be applied as described above.

The sintering typically occurs in an atmosphere inert to the process (e.g., a nitrogen atmosphere) or under a vacuum. The length of time of the initial sintering step can vary depending on the size and shape of the desired article and the temperature and pressure utilized in the process. Typically, the sintering step will take from 1 to about 50 hours, preferably about 5 to about 10 hours.

Sintering techniques are well-known in the art of powder metallurgy and need not be explained in detail here. Any sintering furnace can be used in the invention, so long as the furnace is capable of heating to the necessary sintering temperatures in an atmosphere inert to the process.

In another embodiment, the initial treatment step involves isostatically pressing the powder contained within the mold at a pressure of about 50 to about 500 MPa, preferably about 400 MPa. Isostatic pressure processes and equipment are well-known in the art and need not be discussed herein in detail. In an isostatic pressure process, the powder is placed in a container that provides a physical barrier between the powder and a pressurizing medium. For room temperature or cold isostatic pressing (CIP), the container is typically a rubber or elastomeric material and the pressurizing medium is a liquid, such as water or oil. For high temperature or hot isostatic pressing (HIP), the hermetic container is metal or glass and the pressurizing medium is a gas. Use of this liquid or gas pressurizing system ensures a uniform compaction pressure throughout the powder mass and a homogeneous density distribution in the final product. The pressure utilized in isostatic pressing can be at least about 15,000 psi, and in some cases as high as 60,000 psi or higher.

Following the initial treatment step, the powder material retains the shape of the mold. The rough shape or green is then allowed to cool down and is removed from the mold. At this stage, the density of the shaped powder is low enough (e.g., less than about 80%) to allow the shaped powder to be easily machined into a final precise shape, if desired, using common hardened steel tools and established machining processes.

Following the optional final machining step, the shaped powder is preferably loaded into a sintering furnace and slowly (over several hours) heated to a temperature of, for example, about 2200° C. at approximately atmospheric or sub-atmospheric pressure. The sintering temperature and pressure will vary depending, in part, on the refractory material of the article being sintered. A suitable sintering temperature range for this step is about 2100 to about 2500° C. and suitable pressures range from vacuum to about 10 atm. In one preferred embodiment, the refractory material of the article is TaC, the sintering temperature is about 2300° C., and the sintering pressure is about 1 atm. Suitable atmospheres within the furnace include gases inert to the process such as argon, or nitrogen, or a vacuum, or the atmosphere may contain certain carbon containing species, e.g., a hydrocarbon-containing atmosphere (e.g., methane) or graphite such as solid graphite, graphite foam, or graphite powder. The shaped powder is held at this high temperature for a certain time that depends on work temperature, the size of the shaped powder, and the desired final densification, and then slowly (over several hours) cooled down. The heating process can be either resistive or inductive; however, it is important to achieve a uniform temperature over the whole shape to avoid buildup of internal stresses, which can be detrimental to the lifetime of the end product. Typically, the shaped powder is exposed to the maximum sintering temperature for a period of about 10 to about 50 hours, with a temperature ramp-up period of about 5 to about 20 hours, during which the sintering temperature is raised about 100 to about 400° C. per hour. A typical cool down period is about 5 to about 20 hours, where the temperature of the shaped article is allowed to cool about 100 to about 400° C. per hour. This final sintering step is depicted schematically in FIG. 2b, wherein the "green" molded powder 38 is heated in a furnace 34.

Following completion of the final sintering step, the shaped article is a near-net shape having a homogenous structure that is at least about 90% dense (as compared to theoretical maximum density), more preferably at least about 95% dense, and in certain embodiments, at least about 97% dense. Thus, the shaped article is extremely hard and any machining using conventional metal tools is rendered impractical.

The shaped article has a total porosity, which includes open porosity (i.e., pores exposed to outer surface) and closed porosity (i.e., pores that do not extend to the outer surface), of no more than about 10%, more preferably no more than about 5%, and in certain embodiments, no more than about 3%. A key advantageous feature of the present invention is the ability to produce a shaped article having a remarkably low open porosity, meaning the shaped article is nearly impervious to liquids and gases due to a lack of pores on the outer exposed surface of the article. Typically, the shaped articles made according to the present invention have a total open porosity of no more than about 1.0%, more preferably no more than about 0.5%, and most preferably no more than about 0.25%. In certain embodiments, shaped articles made according to the present invention have no measurable open porosity.

Thus, the present invention provides dense, near-net shaped articles made of materials that cannot be machined using conventional metal tools using a two-stage process where the initial stage produces a shape-sustaining and machinable powder and the final sintering stage produces the final densification. The final sintering step renders the shaped article extremely hard and high-temperature resistant, as well as oxidation resistant. The process of the invention is much more cost effective than the competing plasma-spray technology, offers much more uniform material properties, and has no limitation as to thickness or shape of the product that can be fabricated.

The availability of dense shaped articles made according to the invention, such as articles made of TaC and NbC, will find usefulness in a number of high-temperature applications, such as crystal growth, jet- and rocket-propulsion, machining, and drilling. Specific exemplary applications for the shaped articles of the invention include heating elements and heat shields for applications at high temperatures and in oxidizing atmospheres, jet and rocket engine nozzles, and cutting bits for very hard materials.

Since certain refractory materials used herein (e.g., TaC and NbC) are electrically conducting, they can be used as crucible/susceptor materials for crystal growth in inductively-heated reactors. Since crucibles of any desired wall thickness can be fabricated using the present invention, crucibles according to the invention can be made with sufficient thickness (e.g., greater than about 6 mm) to enable efficient coupling of RF fields into the crucible, even at frequencies as low as 10 kHz, without the need for an additional RF susceptor.

Referring to FIG. 1, an exemplary cylindrical crucible 10 that can be made using the process of the invention is shown. The crucible 10 includes a crucible body 12 defining an open-ended chamber 14 wherein a powder source material 16 may be placed when the crucible is used in crystal growth processes (e.g., physical vapor transport processes). As shown, the chamber 14 is defined by the wall surface and the bottom surface of the crucible body 12. The crucible 10 further includes a removable cap 18. As shown, a seed material 20 can be fused to the cap 18 during crystal growth processes. Although a cylindrical shape is illustrated in FIG. 1, other crucible shapes can be used without departing from the present invention. Typically, crucibles used in the method of the invention will have a height of about 1 to about 10 inches (e.g., about 1 to about 5 inches), a wall thickness of about 1/16 to about 5/8 inch (e.g., about 1/8 to about 1/2 inch), and a width or outer diameter of about 0.5 to about 5 inches (e.g., about 1 to about 5 inches). Again, as noted above, the present invention can be used to fabricate crucibles having relatively thick walls that can be particularly useful when using an inductively-heated reactor. Unlike crucibles prepared using plasma spray technology, the crucibles of the invention do not comprise relatively thin coatings of a refractory material. Instead, the present invention forms crucibles characterized by a homogeneous wall structure across its thickness.

The high-temperature sublimation/recondensation process used for the growth of AlN and SiC single crystals will greatly and immediately profit from availability of this technology. Since these crystal growth processes require extremely high temperatures (>2200° C.), contamination is a serious issue. Due to an exceptionally low vapor pressure and stability of many of the refractory materials used herein, they are ideally suited for clean, high-temperature crystal growth applications and the invention can, therefore, be considered an enabling innovation for high-purity sublimation growth of next-generation, wide bandgap electronic materials. For example, elemental analysis of AlN crystals grown in TaC crucibles made according to the invention revealed extremely low Ta contamination, below the analytical detection limit of 1 ppm by weight, and C and O contamination levels as low as 50 ppm by weight. TaC crucibles made according to the invention were re-used in several consecutive growth runs and average crucible lifetimes exceeded 200 hrs at growth temperatures exceeding 2200° C. The analyzed TaC crucible walls exposed to the Al vapor showed continued grain growth and densification, but no alloying with Al or nitrogen.

Many modifications and other embodiments of the inventions set forth herein will come to mind to one skilled in the art to which these inventions pertain having the benefit of the teachings presented in the foregoing description. Therefore, it is to be understood that the inventions are not to be limited to the specific embodiments disclosed and that modifications and other embodiments are intended to be included within the scope of the invention. Although specific terms are employed herein, they are used in a generic and descriptive sense only and not for purposes of limitation.

That which is claimed:

1. A method of forming a dense, shaped article formed of a refractory material, comprising;

providing a refractory material powder having a melting point of at least about 2900° C., the refractory material powder consisting of a refractory material selected from the group consisting of carbides of tantalum, niobium or hafnium, nitrides of tantalum, niobium or hafnium, and alloys or powder mixtures thereof;

placing the refractory material powder in a mold configured to form the powder into a desired shape;

treating the mold containing the powder at a temperature and pressure sufficient to form a self-supporting and shape-sustaining molded powder that conforms to the shape of the mold, wherein said treating step comprises applying an isostatic or uni-axial pressure;

machining the shape-sustaining molded powder to further shape the molded powder; and sintering the shape-sustaining molded powder in an inert atmosphere at a pressure ranging from vacuum to about 10 atm and at a temperature and for a time sufficient to produce a dense shaped article having a density greater than about 90%, a total porosity of no more than about 10%, and a total open porosity of no more than about 1%.

2. The method of claim 1, wherein said treating step comprises sintering the powder contained within the mold at a temperature of about 1000 to about 2000° C. while concurrently applying a uni-axial pressure of at least about 50 MPa.

3. The method of claim 2, wherein said treating step comprises sintering the powder contained within the mold at a temperature of about 1500 to about 1700° C. while concurrently applying a uni-axial pressure of at least about 100 MPa.

4. The method of claim 1, wherein said treating step comprises isostatically pressing the powder contained within the mold at a pressure of about 50 to about 500 MPa and at about room temperature.

5. The method of claim 1, wherein said sintering step comprises sintering the shape-sustaining molded powder at a temperature of about 2100 to about 2500° C.

6. The method of claim 1, wherein said sintering step comprises sintering the shape-sustaining molded powder at a maximum sintering temperature for about 10 to about 50 hours, with a temperature ramp-up period of about 5 to about 20 hours during which the sintering temperature is raised about 100 to about 400° C. per hour, and a cool down period of about 5 to about 20 hours during which the sintering temperature is decreased about 100 to about 400° C. per hour.

7. The method of claim 1, wherein the shape-sustaining molded powder has a density of about 60 to about 80%.

8. The method of claim 1, wherein the dense, shaped article has a density greater than about 95%, a total porosity of no more than about 5%, and a total open porosity of no more than about 0.5%.

9. The method of claim 1, wherein the dense, shaped article has a density greater than about 97%, a total porosity of no more than 3%, and a total open porosity of no more than about 0.25%.

10. The method of claim 1, wherein the mold is adapted for forming the refractory material into the shape of a crucible.

11. The method of claim 1, wherein the refractory material powder consists of a tantalum carbide powder.

12. The method of claim 1, wherein the refractory material powder has a melting point of at least about 3200° C.

13. The method of claim 1, wherein the refractory material powder has a melting point of at least about 3600° C.

14. A method of forming a dense, shaped, tantalum carbide article, comprising;
- providing a refractory material powder consisting of tantalum carbide;
- placing the powder in a mold configured to form the powder into a desired shape;
- sintering the powder contained within the mold in an inert atmosphere or under a vacuum and at a temperature of at least about 1500° C., while concurrently applying a uni-axial pressure of at least about 50 MPa, to form a self-supporting and shape-sustaining molded tantalum carbide powder that conforms to the shape of the mold, the molded powder having a density of about 60 to about 80%;
- machining the shape-sustaining molded tantalum carbide powder to further shape the molded powder; and
- sintering the shape-sustaining molded tantalum carbide powder in an inert atmosphere at a temperature of about 2100 to about 2500° C. and a pressure ranging from vacuum to about 10 atm for a time sufficient to produce a dense, shaped, tantalum carbide article having a density greater than about 95%, a total porosity of no more than about 5%, and a total open porosity of no more than about 0.5%.

15. The method of claim 14, wherein said treating step comprises sintering the powder at a temperature of about 1500 to about 1700° C. and applying a uni-axial pressure of at least about 100 MPa.

16. The method of claim 14, wherein said sintering step comprises sintering the shape-sustaining molded powder at a maximum sintering temperature for about 10 to about 50 hours, with a temperature ramp-up period of about 5 to about 20 hours during which the sintering temperature is raised about 100 to about 400° C. per hour, and a cool down period of about 5 to about 20 hours during which the sintering temperature is decreased about 100 to about 400° C. per hour.

17. The method of claim 14, wherein the dense, shaped article has a density greater than about 97%, a total porosity of no more than 3%, and a total open porosity of no more than about 0.25%.

18. A method of forming a dense, shaped article formed of a refractory material, comprising;
- providing a refractory material powder consisting of a refractory material selected from the group consisting of carbides of tantalum, niobium or hafnium, nitrides of tantalum, niobium or hafnium, and alloys or powder mixtures thereof;
- placing the refractory material powder in a mold configured to form the powder into a desired shape;
- treating the powder at a temperature and pressure sufficient to form a self-supporting and shape-sustaining molded powder that conforms to the shape of the mold and has a density of about 60% to about 80% of theoretical density, wherein said treating step comprises applying an isostatic pressure of about 50 to about 500 MPa or a uni-axial pressure of least about 50 MPa;
- machining the shape-sustaining molded powder to further shape the molded powder; and
- sintering the shape-sustaining molded powder in an inert atmosphere at a pressure ranging from vacuum to about 10 atm, wherein said sintering step comprises heating the shape-sustaining molded powder into a range of about 2100° C. to about 2500° C., and wherein said sintering step continues for a time sufficient to produce a dense shaped article having a density greater than about 95%, a total porosity of no more than about 5%, and a total open porosity of no more than about 0.5%.

19. The method of claim 18, wherein said treating step comprises sintering the powder in an inert atmosphere or under a vacuum and at a temperature of at least about 1500° C.

20. The method of claim 18, wherein said treating step comprises sintering the powder at a temperature of about 1500 to about 1700° C. and applying a uni-axial pressure of at least about 100 MPa.

21. The method of claim 18, wherein said sintering step comprises sintering the shape-sustaining molded powder at a maximum sintering temperature for about 10 to about 50 hours, with a temperature ramp-up period of about 5 to about 20 hours during which the sintering temperature is raised about 100 to about 400° C. per hour, and a cool down period of about 5 to about 20 hours during which the sintering temperature is decreased about 100 to about 400° C. per hour.

22. The method of claim 18, wherein the dense, shaped article has a density greater than about 97%, a total porosity of no more than 3%, and a total open porosity of no more than about 0.25%.

23. The method of claim 18, wherein the refractory material powder consists of a tantalum carbide powder.

* * * * *